United States Patent
Lee et al.

(10) Patent No.: US 10,976,472 B2
(45) Date of Patent: Apr. 13, 2021

(54) META-OPTICAL DEVICE AND METHOD OF MANUFACTURING THE SAME

(71) Applicant: SAMSUNG ELECTRONICS CO., LTD., Suwon-si (KR)

(72) Inventors: Jeongyub Lee, Yongin-si (KR); Changseung Lee, Yongin-si (KR); Yongsung Kim, Suwon-si (KR); Jaekwan Kim, Hwaseong-si (KR); Byonggwon Song, Seoul (KR); Sanghoon Song, Hwaseong-si (KR); Kiyeon Yang, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 161 days.

(21) Appl. No.: 15/805,864

(22) Filed: Nov. 7, 2017

(65) Prior Publication Data

US 2018/0224574 A1    Aug. 9, 2018

(30) Foreign Application Priority Data

Feb. 3, 2017   (KR) .................. 10-2017-0015694

(51) Int. Cl.
    *G02B 1/02*     (2006.01)
    *G02B 1/00*     (2006.01)
    *C23C 14/58*    (2006.01)
    *C23C 14/06*    (2006.01)
    *C23C 14/34*    (2006.01)
    (Continued)

(52) U.S. Cl.
    CPC .......... *G02B 1/002* (2013.01); *C23C 14/0617* (2013.01); *C23C 14/34* (2013.01); *C23C 14/5806* (2013.01); *C23C 16/401* (2013.01); *G02B 1/02* (2013.01); *C23C 16/50* (2013.01);
    *G02B 3/00* (2013.01); *Y10T 428/24355* (2015.01); *Y10T 428/24364* (2015.01)

(58) Field of Classification Search
    CPC ..... G02B 1/002–02; G02B 1/118; B32B 3/26; B32B 3/263; B32B 3/30; Y10T 428/24355; Y10T 428/24364; Y10T 428/24479–2462
    See application file for complete search history.

(56) References Cited

U.S. PATENT DOCUMENTS

| 6,040,936 A | 3/2000 | Kim et al. |
| 7,750,869 B2 | 7/2010 | Mosallaei |

(Continued)

FOREIGN PATENT DOCUMENTS

WO   WO-2014207378 A1 * 12/2014 ............. H01L 33/10

OTHER PUBLICATIONS

Lee et al: "Nanofabrication of low extinction coefficient and high-aspect-ratio Sistructures for metaphotonic applications", Proc. of SPIE, 2016, vol. 9927, (11 pages total).

(Continued)

*Primary Examiner* — Z. Jim Yang
(74) *Attorney, Agent, or Firm* — Sughrue Mion, PLLC (57) ABSTRACT

A meta-optical device and a method of manufacturing the same are provided. The method includes depositing a group III-V compound semiconductor on a substrate, forming an anti-oxidation layer, performing crystallization by using post annealing, removing the anti-oxidation layer, and manufacturing a meta-optical device by using patterning.

17 Claims, 7 Drawing Sheets

(51) Int. Cl.
  *C23C 16/40* (2006.01)
  *G02B 3/00* (2006.01)
  *C23C 16/50* (2006.01)

(56) References Cited

U.S. PATENT DOCUMENTS

| | | | |
|---|---|---|---|
| 8,879,158 B2* | 11/2014 | Choi | H01Q 15/0086 359/642 |
| 9,417,465 B2 | 8/2016 | Hussein et al. | |
| 2002/0135869 A1* | 9/2002 | Banish | H01L 27/14627 359/350 |
| 2004/0113163 A1* | 6/2004 | Steigerwald | H01L 33/22 257/88 |
| 2009/0040132 A1 | 2/2009 | Sridhar et al. | |
| 2009/0169828 A1* | 7/2009 | Hersee | H01L 29/045 428/172 |
| 2010/0091224 A1* | 4/2010 | Cho | G02B 5/201 349/105 |
| 2011/0272723 A1* | 11/2011 | Ha | H01L 33/0093 257/98 |
| 2012/0298954 A1* | 11/2012 | Kim | H01L 33/42 257/13 |
| 2014/0294338 A1* | 10/2014 | Long | G02F 1/011 385/8 |
| 2014/0339577 A1* | 11/2014 | Mandl | H01L 33/32 257/88 |
| 2014/0374268 A1* | 12/2014 | Wu | C25D 1/04 205/118 |
| 2015/0108428 A1* | 4/2015 | Shatalov | H01L 21/0242 257/18 |
| 2015/0144873 A1* | 5/2015 | Hwang | H01L 33/08 257/13 |
| 2015/0179883 A1* | 6/2015 | Cheng | H01L 21/02639 438/29 |
| 2015/0207033 A1* | 7/2015 | Kryliouk | H01L 33/0025 257/13 |
| 2015/0372186 A1* | 12/2015 | Cha | H01L 33/08 438/34 |
| 2016/0013364 A1* | 1/2016 | Cha | H01L 33/24 438/34 |
| 2016/0035941 A1* | 2/2016 | Herner | H01L 33/06 257/13 |
| 2016/0064608 A1* | 3/2016 | Chung | H01L 33/24 257/13 |
| 2016/0284938 A1* | 9/2016 | Hyot | H01L 33/32 |
| 2016/0307939 A1* | 10/2016 | Wang | H04B 10/6971 |
| 2017/0082263 A1* | 3/2017 | Byrnes | G02B 5/1809 |
| 2017/0323925 A1* | 11/2017 | Schneider, Jr. | H01L 27/156 |
| 2018/0045953 A1* | 2/2018 | Fan | G02B 5/18 |
| 2018/0136370 A1* | 5/2018 | Busse | C03C 25/68 |
| 2018/0204976 A1* | 7/2018 | Kim | H01L 31/184 |
| 2019/0051770 A1* | 2/2019 | Liu | H01L 27/1446 |
| 2019/0081206 A1* | 3/2019 | Banna | H01L 33/44 |
| 2019/0154877 A1* | 5/2019 | Capasso | G02B 1/00 |
| 2019/0172970 A1* | 6/2019 | Dupont | H01L 27/156 |
| 2019/0383969 A1* | 12/2019 | Badano | G02B 27/005 |
| 2020/0025893 A1* | 1/2020 | Jang | H01S 5/18344 |

OTHER PUBLICATIONS

Arbabi et al: "Subwavelength-thick lenses with high numerical apertures and large efficiency based on high-contrast transmitarrays", Nature Communications 6, Article No. 7069 (2015), (14 pages total).

Khorasaninejad et al: "Metalenses at visible wavelengths: Diffraction-limited focusing and subwavelength resolution imaging", sciencemag.org, Jun. 3, 2016, vol. 352, Issue 6290, (6 pages total).

Arbabi et al: "Subwavelength-thick lenses with high numerical apertures and large efficiency based on high-contrast transmitarrays", Nature Communications, 2015, (6 pages total).

\* cited by examiner

FIG. 8A (Deposition)

FIG. 8B (Post-annealing)

META-OPTICAL DEVICE AND METHOD OF MANUFACTURING THE SAME

CROSS-REFERENCE TO RELATED APPLICATION

This application claims priority from Korean Patent Application No. 10-2017-0015694, filed on Feb. 3, 2017 in the Korean Intellectual Property Office, the disclosure of which is incorporated by reference herein in its entirety.

BACKGROUND

1. Field

Devices and methods consistent with the present disclosure relate to a meta-optical device and a method of manufacturing the same.

2. Description of the Related Art

Artificial meta-structures with thicknesses, patterns, or cycles that are smaller than wavelengths of incident light have optical properties that are not found in nature.

Structures using surface plasmon resonance, which occurs at a boundary between a metal layer and a dielectric layer, and structures using boundary properties between dielectric materials having different refractive indices are the structures that are generally used as meta-structures.

Since meta-structures may exhibit various optical properties at high response speeds and are suitable for ultra-small devices, there have been continuous attempts to apply meta-structures to optical devices for the purposes of changing transmissions/reflections, polarizations, phases, intensities, and paths of incident light.

SUMMARY

One or more exemplary embodiments provide meta-optical devices that may be used in a visible wavelength region and a near-infrared wavelength region, and methods of manufacturing the meta-optical devices.

One or more exemplary embodiments also provide methods of manufacturing meta-optical devices at low cost.

According to an aspect of an exemplary embodiment, there is provided a meta-optical device including: a support layer; and a plurality of nano-structures formed from a group III-V compound semiconductor provided on the support layer and arranged to form a shape-dimension distribution in which the phase of incident light varies based on a predetermined principle according to the position, wherein shape dimensions of the plurality of nano-structures are smaller than a wavelength of the incident light, the wavelength of the incident light ranges from about 300 nm to about 1000 nm.

The wavelength of the incident light may be in the range of from about 400 nm to about 750 nm.

The plurality of nano-structures may be formed from a material selected from among AlN, GaN, GaP, AlAs, and AlSb.

The each of the plurality of nano-structures may have a cylindrical shape, a polyprism shape, or a stripe shape.

A refractive index of each of the plurality of nano-structures may be greater than a refractive index of the support layer.

The meta-optical device may further include a cover layer that covers the plurality of nano-structures and has a refractive index different from a refractive index of each of the plurality of nano-structures.

The refractive index of the cover layer may be the same as a refractive index of the support layer.

According to an aspect of another exemplary embodiment, there is provided a method of manufacturing a meta-optical device including: preparing a substrate; forming a nano-material layer by depositing a group III-V compound semiconductor on the substrate; forming an anti-oxidation layer on the nano-material layer; crystallizing the nano-material layer by post-annealing the nano-material layer; removing the anti-oxidation layer; and forming a plurality of nano-structures by patterning the crystallized nano-material layer.

The nano-material layer may be formed from a material selected from among AlN, GaN, GaP, AlAs, and AlSb.

The forming the nano-material layer may be performed by using a sputtering process.

An upper limit of a sputtering temperature may be determined so that a thickness of an oxide film formed on a surface of the nano-material layer during the sputtering process is less than 2 nm.

The sputtering temperature may range from about 150° C. to about 350° C.

A thickness of the anti-oxidation layer may range from about 50 nm to about 1 μm.

The anti-oxidation layer may be formed from any material selected from among $SiO_2$, $Si_3N_4$, $TiO_2$, and ITO.

A temperature of the post-annealing may be equal to or lower than a thermal dissociation temperature of the nano-material layer.

The temperature of the post-annealing may range from about 400° C. to about 850° C.

The method may further include forming a cover layer configured to cover the plurality of nano-structures.

The method may further include forming a conductive layer having a light transmittance on the crystallized nano-material layer before the patterning is performed.

The method may further include: removing the conductive layer after the patterning is performed; and forming a cover layer configured to cover the plurality of nano-structures.

According to an aspect of another exemplary embodiment, there is provided a meta-optical device manufactured by using the method.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Exemplary embodiments will now be described more fully with reference to the accompanying drawings. In the drawings, the thicknesses of layers and regions may be exaggerated for clarity, and the sizes of elements may be exaggerated for convenience of explanation. Herein, like reference characters represent like elements unless otherwise indicated. It is to be understood that the foregoing is illustrative of exemplary embodiments and does not limit the specific embodiments disclosed. It should also be understood that modifications to the disclosed embodiments, as well as other embodiments, are within the scope of the appended claims and present disclosure.

It will be understood that when a component is referred to as being "on" another component, the component can be directly on the other component or intervening components may be present thereon.

As used herein, the singular forms "a", "an", and "the" are intended to include the plural forms as well, unless the context clearly indicates otherwise. It will be further understood that the terms "comprises," "comprising," "includes" and/or "including" used herein specify the presence of stated components, but do not preclude the presence or addition of one or more other components.

The steps of all methods described herein can be performed in any suitable order unless otherwise indicated herein or otherwise clearly contradicted by context. The present disclosure is not limited to the described order of the steps. The use of any and all examples, or exemplary language (e.g., "such as") provided herein, is intended merely to better illuminate the present disclosure and does not provide a limitation on the scope of the present disclosure unless otherwise claimed.

As used herein, the term "and/or" includes any and all combinations of one or more of the associated listed items.

Figure 1:
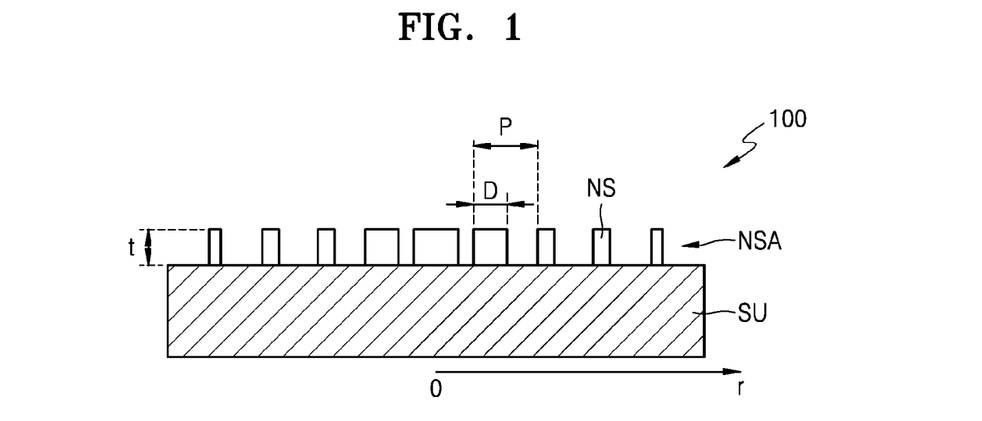
FIG. 1 is a cross-sectional view illustrating a structure of a meta-optical device according to an exemplary embodiment.

FIG. 1 is a cross-sectional view illustrating a structure of a meta-optical device 100 according to an exemplary embodiment. Referring to FIG. 1, the meta-optical device 100 includes a support layer SU and a nano-structure array NSA which includes a plurality of nano-structures NS that are arranged on the support layer SU.

The nano-structures NS have shape dimensions of a sub-wavelength size. When the nano-structures NS have shape dimensions of a sub-wavelength size, it means that a thickness 't' and a pitch 'P', which are dimensions for defining the shapes of the nano-structures NS, are smaller than an operating wavelength of the meta-optical device 100. For example, the nano-structures NS may have, but are not limited to, cylindrical shapes. When the nano-structures NS have cylindrical shapes, reference symbol D of FIG. 1 may denote a diameter. When the nano-structures NS have polyprism shapes, the reference symbol D of FIG. 1 may denote a length of one side or a diagonal length of a polygon.

The position of a wavefront that joins points of the same phase in light passing through the meta-optical device 100 is different when the light passes through both the nano-structures NS and the support layer SU than it is when the light passes through only the support layer SU. This is because of phase delay due to the nano-structures NS having sub-wavelength shape dimensions, and the amount of phase delay is determined by the specific shape dimensions of the nano-structures NS. Accordingly, when a plurality of nano-structures NS are provided, various optical functions may be performed by appropriately setting the amount of phase delay occurring in each of the nano-structures NS.

The nano-structures NS may be arranged so as to have a shape-dimension distribution in which a phase of incident light varies based on a predetermined principle according to a position. Shape dimensions at each position are determined according to an optical function to be performed by the meta-optical device 100. For example, when a position 'r' of the nano-structure NS is defined as a distance from the center '0' of the meta-optical device 100 in a radial direction, a length of the nano-structure NS at the position 'r' may be denoted as D(r). Dimensions and arrangements are determined so that the meta-optical device 100 according to an exemplary embodiment performs a function of a convex lens, that is, has positive refractive power and focuses light. In an exemplary embodiment, the nano-structure NS has a cylindrical shape. Referring to FIG. 1, the length 'D' may decrease from the center in the radial direction, and the shown regularity may be repeated in the radial direction. A repetition period may change instead of being constant. An arrangement of the nano-structure array NSA may be periodic or quasi-periodic.

Since a degree of the function of a convex lens, that is, a refractive power or a focal length, performed by the meta-optical device 100 is adjusted by a value used as the length D(r) according to the position 'r' of the nano-structure NS, a volume does not increase as refractive power increases, unlike an existing lens for adjusting refractive power by utilizing curvature.

Although the plurality of nano-structures NS have the same thickness in FIG. 1, exemplary embodiments are not limited thereto. The thicknesses of the nano-structure NS may be changed as long as the thicknesses are within a range of a sub-wavelength. For example, the nano-structures NS may have a stepped thickness distribution.

Also, although each nano-structure NS has a cylindrical shape in FIG. 1, the shape of the nano-structure NS is not limited thereto. The cross-sectional shape of the nano-structure NS may be appropriately determined so as to perform the function of the meta-optical device 100. For example, the nano-structure NS may have any of various cross-sectional shapes, such as a square shape, a rectangular shape, an oval shape, or a triangular shape.

Figure 2:
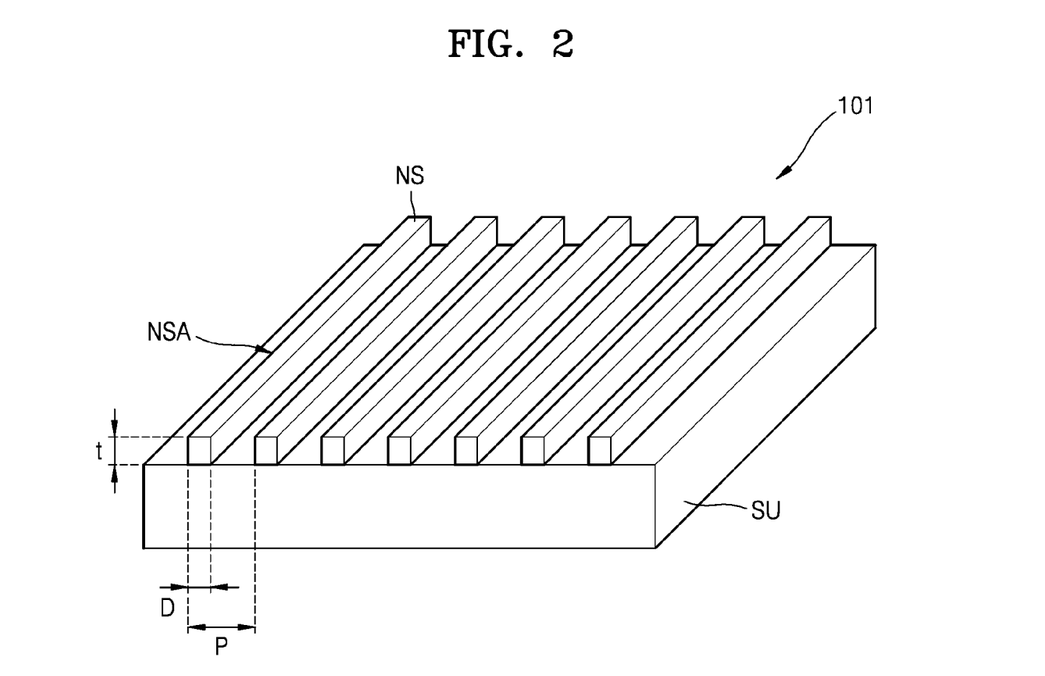
FIG. 2 is a perspective view illustrating a structure of a meta-optical device according to another exemplary embodiment.

Also, although the nano-structure NS has a nano-post (e.g., nano-pole, nano-column, nano-pillar) shape in FIG. 1, the shape of the nano-structure NS is not limited thereto. For example, the nano-structure NS may have a nano-stripe shape. In this respect, FIG. 2 is a perspective view illustrating a structure of a meta-optical device 101 according to another exemplary embodiment. Referring to FIG. 2, the meta-optical device 101 includes a support layer SU and a nano-structure array NSA including a plurality of nanostructures NS that are arranged on the support layer SU. The nano-structure NS shown in FIG. 2 has a stripe shape with a square cross-section.

The function of the meta-optical device 100 is not limited to a convex lens. For example, the shape-dimension distribution of the nano-structures NS may be arranged so as to perform any of various functions, such as a concave lens, a light deflector for deflecting light, a convex mirror or a concave mirror having a flat panel shape by additionally including a reflective layer, a color filter, a spectrometer, or a wide-band filter.

For example, functions of a convex lens, a concave lens, a light deflector, or a wide-band filter may be performed by using a nano-structure NS having a nano-post shape. Also as an example, functions of a color filter or a spectrometer may be performed by using a nano-structure NS having a nano-stripe shape.

Figure 3:
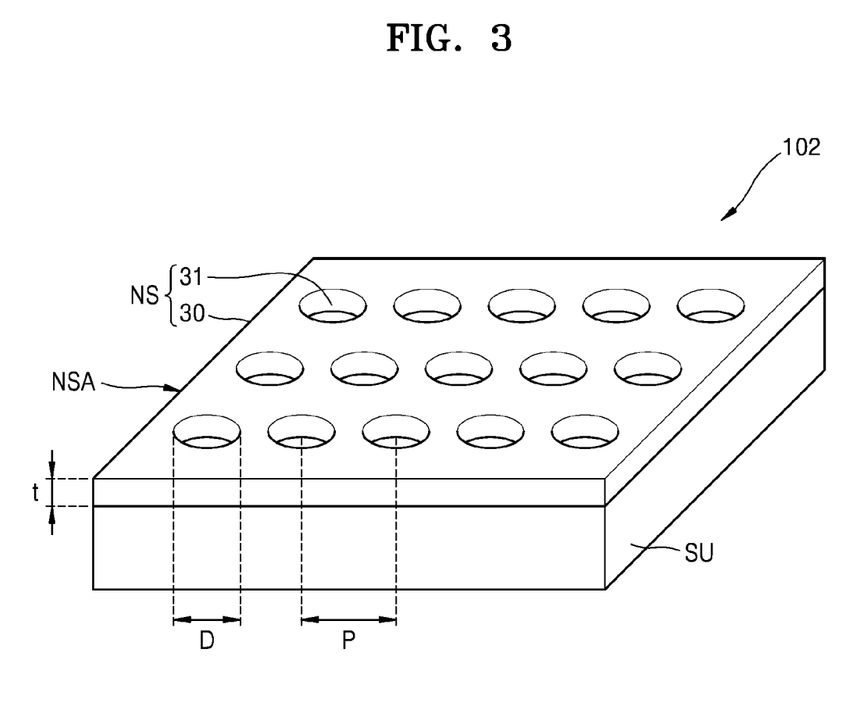
FIG. 3 is a perspective view illustrating a structure of a meta-optical device according to another exemplary embodiment.

Also, although the nano-structures NS are shown as being embossed in FIGS. 1 and 2, the nano-structures NS may be engraved, that is, may have nano-hole structures. FIG. 3 is a perspective view illustrating a structure of a meta-optical device 102 according to another exemplary embodiment. Referring to FIG. 3, the meta-optical device 102 includes a support layer SU and a nano-structure array NSA including a plurality of nano-structures NS that are arranged on the support layer SU. The nano-structures NS have engraved cylindrical shapes. FIG. 3 shows a nano-structure forming layer 30 provided on the support layer SU. Each of the nano-structures NS may include a concave portion 31 having a cylindrical shape and provided on the nano-structure forming layer 30.

A refractive index of the nano-structure NS may be greater than a refractive index of the support layer SU. The support layer SU may include a material having a refractive index less than that of the nano-structure NS. The support layer SU may be formed from, for example, a transparent material. For example, glass, silicon dioxide ($SiO_2$), or a polymer material such as polymethyl methacrylate (PMMA) or polydimethylsiloxane (PDMS) may be used as a material of the support layer SU. Silicon (Si) may be used as a material of the support layer SU according to a wavelength of incident light.

The support layer SU may include a reflective layer for reflecting incident light, a light-emitting device for generating light, or an optical device for performing an additional optical function.

Figure 4:
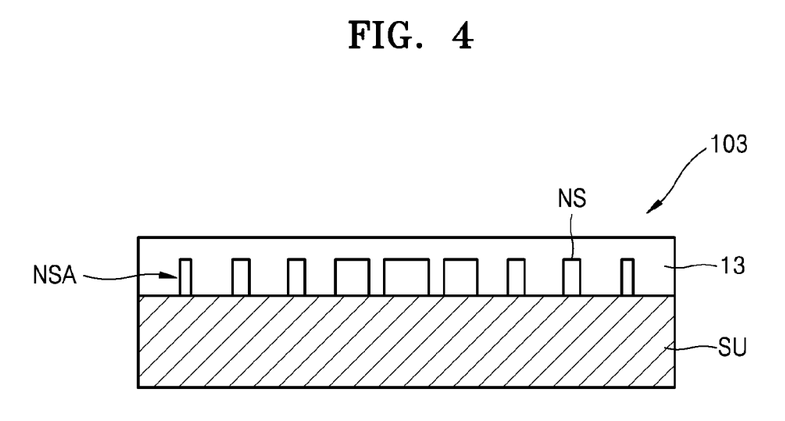
FIG. 4 is a cross-sectional view illustrating a structure of a meta-optical device according to another exemplary embodiment.

FIG. 4 is a cross-sectional view illustrating a structure of a meta-optical device 103 according to another exemplary embodiment. Referring to FIG. 4, the meta-optical device 103 includes a support layer SU and a nano-structure array NSA including a plurality of nano-structures NS that are arranged on the support layer SU, and may further include a cover layer 13 configured so as to cover the nano-structures NS and have a refractive index different from the refractive index of each of the nano-structures NS. The refractive index of the cover layer 13 may be less than the refractive index of the nano-structure NS, and may be the same as the refractive index of the support layer SU. The cover layer 13 may be formed from the same material as the support layer SU. As examples, the cover layer 13 may be formed from air, $SiO_2$, $Si_3N_4$, spin-on glass (SOG), or glass. If FIG. 1 were to show a cover layer, the cover layer 13 would be air.

Figure 5:
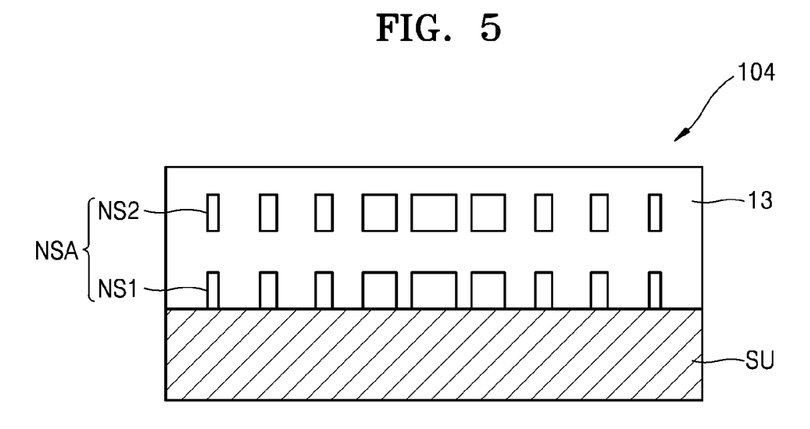
FIG. 5 is a cross-sectional view illustrating a structure of a meta-optical device according to another exemplary embodiment.

FIG. 5 is a cross-sectional view illustrating a structure of a meta-optical device 104 according to another exemplary embodiment. Referring to FIG. 5, the meta-optical device 104 includes a support layer SU, a nano-structure array NSA including a plurality of nano-structures NS that are arranged on the support layer SU, and a cover layer 13. The nano-structure array NSA may have a structure in which two or more nano-structures are stacked, such as shown in FIG. 5. For example, the nano-structure array NSA may include first and second nano-structures NS1 and NS2 that are stacked. The cover layer 13 in FIG. 5 entirely covers the nano-structure array NSA, that is, the first and second nano-structures NS1 and NS2. The refractive index of the cover layer 13 may be less than the refractive index of each of the first and second nano-structures NS1 and NS2, and may be the same as the refractive index of the support layer SU. The cover layer 13 may be formed from the same material as the support layer SU.

Figure 6:
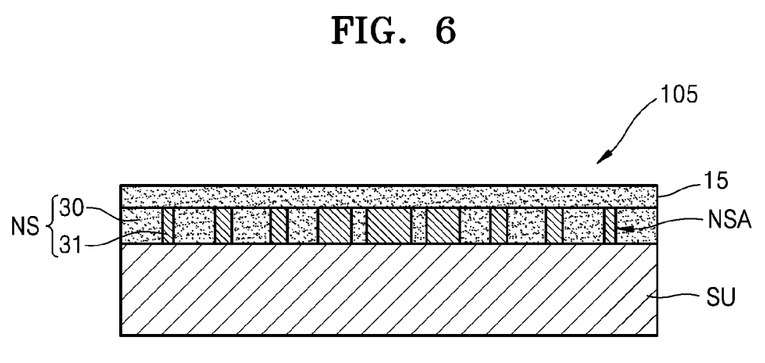
FIG. 6 is a cross-sectional view illustrating a structure of a meta-optical device according to another exemplary embodiment.

FIG. 6 is a cross-sectional view illustrating a structure of a meta-optical device 105 according to another exemplary embodiment. Referring to FIG. 6, the meta-optical device 105 includes a support layer SU and a nano-structure array NSA including a plurality of nano-structures NS that are arranged on the support layer SU. The nano-structures NS have engraved structures in FIG. 6, that is, they have nano-hole structures. For example, the nano-structures NS may have engraved cylindrical shapes. A nano-structure forming layer 30 is provided on the support layer SU. Each of the nano-structures NS may include a concave portion 31 having a cylindrical shape which is provided on the nano-structure forming layer 30. A cover layer 15 entirely covers the nano-structure array NSA, that is, the nano-structures NS. The cover layer 15 fills the concave portion 31.

Although not shown in FIGS. 1 through 6, an upper dielectric layer and a lower dielectric layer may be provided over and/or under the nano-structure array NSA, if necessary.

Figure 7:
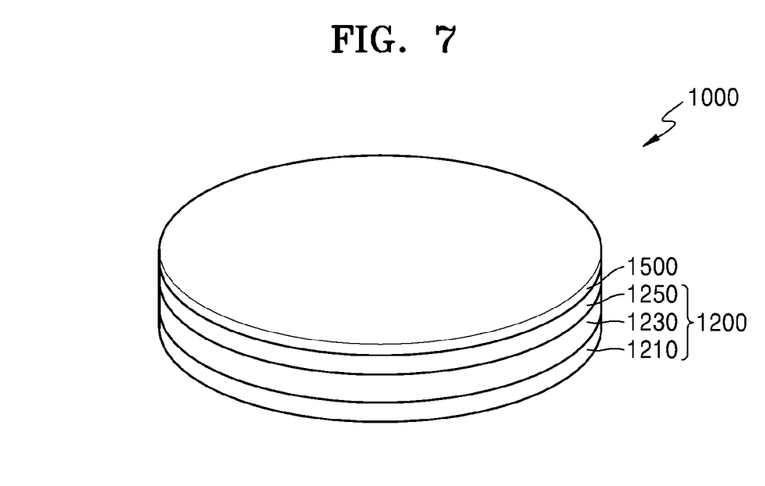
FIG. 7 is a perspective view illustrating a configuration of an optical device using a meta-optical device according to an exemplary embodiment.

FIG. 7 is a perspective view illustrating a configuration of an optical device 1000 including a meta-optical device 1500 according to an exemplary embodiment. Referring to FIG. 7, the optical device 1000 includes a light-emitting device 1200 and the meta-optical device 1500 located on the light-emitting device 1200. The light-emitting device 1200 may be a laser device, such as a vertical-external-cavity surface-emitting laser (VECSEL) including a gain layer 1230 and reflective layers 1210 and 1250 located on both sides of the gain layer 1230. The reflective layers 1210 and 1250 may be distributed Bragg reflectors (DBRs).

The meta-optical device 1500 may be located on an emission surface of the light-emitting device 1200 and may focus, diverge, shape, or deflect light generated and emitted by the light-emitting device 1200. The meta-optical device 1500 may be any of the previously described meta-optical devices 100 through 105, and a shape, a size, and an arrangement of the nano-structures NS may be determined according to an optical function to be performed.

Although the meta-optical device 1500 is shown as being applied to the light-emitting device 1200, embodiments are not limited thereto and the meta-optical device 1500 may be applied to any of various types of optical devices, for example, a polarizer, a polarization cleanup module, an optical filter, a sensor, or a display device.

In order to achieve high light transmittance, the nano-structure NS needs to be formed from a material having low absorbance of wavelengths of incident light. Optical modulation efficiency may increase as refractive index increases. Also, since an aspect ratio of the nano-structure NS may decrease as a refractive index increases, a burden on manufacturing processes may be lowered. The term 'aspect ratio' refers to a ratio between the thickness 't' and the length 'D' of the nano-structure NS. Accordingly, the nano-structure NS needs to be formed from a material having a relatively high refractive index. Also, a material used to form the nano-structure NS needs to be a material that enables a single-layer having a low surface roughness to be formed. A high surface roughness may cause a decrease in the uniformity of optical modulation characteristics of the nano-structure NS. A surface roughness, for example, a root mean square (RMS) surface roughness (Rq), of the single-layer needs to be less than, for example, 2.5 nm.

Silicon (Si), for example, polycrystalline silicon (p-Si) or single-crystal silicon (c-Si), may be used as a material for the nano-structure NS. Silicon has a relatively high refractive index of, for example, about 3.5 and a low extinction coefficient of, for example, $1 \times 10^{-5}$ or less in an infrared (IR) wavelength band of 1550 nm. However, since silicon has very high extinction coefficients of, for example, about 0.044 and about 0.141, in visible wavelength bands of 550 nm and 450 nm, a light transmittance is greatly decreased. Accordingly, it is difficult to use silicon for a nano-structure NS that operates in the visible wavelength band.

A material used to form the nano-structure NS is required to have a low extinction coefficient in a visible wavelength band. The material used to form the nano-structure NS is also required to have a high refractive index in order to reduce an aspect ratio of the nano-structure NS. The material used to form the nano-structure NS is also required to be suitable for manufacturing processes forming a single-layer having a surface roughness less than 2.5 nm.

Table 1 shows a band gap, an extinction coefficient k, and a refractive index n of a group III-V compound semiconductors in the wavelength band of 550 nm.

TABLE 1

|  | band gap(eV) | k | n |
|---|---|---|---|
| AlN | 6.02 | $<1 \times 10^{-5}$ | 2.167 |
| GaN | 3.39 | $<1 \times 10^{-5}$ | 2.408 |
| GaP | 2.26 | $<1 \times 10^{-5}$ | 3.450 |
| AlAs | 2.12 | $<1 \times 10^{-5}$ | 3.248 |
| AlSb | 1.58 | 0.120 | 4.259 |
| GaAs | 1.42 | 0.298 | 4.057 |
| InP | 1.35 | 0.397 | 3.656 |
| AlGaAs(Al:Ga = 49:51) | 1.17 | 0.164 | 3.761 |
| InGaAs(In:Ga = 53:47) | 0.75 | 0.591 | 0.415 |
| GaSb | 0.73 | 1.789 | 4.492 |
| InAs | 0.35 | 0.850 | 4.224 |
| InSb | 0.17 | 1.879 | 4.136 |

Referring to Table 1, since each of AlN, GaN, GaP, and AlAs from among group III-V compound semiconductors has a large band gap, each of AlN, GaN, GaP, and AlAs has a very low extinction coefficient less than $1 \times 10^{-5}$ in the wavelength band of 550 nm. This means that each of AlN, GaN, GaP, and AlAs may be used as an optical material having a high light transmittance in a visible wavelength band. Also, since each of AlN, GaN, GaP, and AlAs has a high refractive index, each of AlN, GaN, GaP, and AlAs may have good optical modulation characteristics, such as a phase shift, and may reduce the aspect ratio of the nano-structure NS, thereby leading to high manufacturing processibility.

$TiO_2$ is known as a material having a highest refractive index from among materials that may be used in the visible wavelength band, and has a refractive index of about 2.45 in the wavelength band of 550 nm. Each of AlN and GaN has a refractive index close to the refractive index of $TiO_2$. Accordingly, each of AlN and GaN may be used as a substitute for $TiO_2$. In addition, each of GaP and AlAs has a refractive index that is about 1.5 times greater than that of $TiO_2$. The aspect ratio of the nano-structure NS for performing the function of a flat lens when $TiO_2$ is used has to be greater than 15:1. However, since each of GaP and AlAs has a refractive index that is about 1.5 times greater than that of $TiO_2$, the nano-structure NS for performing the function of a flat lens may be formed even when an aspect ratio is equal to or less than 15:1 when GaP or AlAs is used. Also, since AlSb has a relatively low extinction coefficient and a very high refractive index, AlSb may be used in a nano-structure NS of a meta-optical device that requires high optical modulation efficiency.

Accordingly, when the nano-structure NS is formed from a material selected from among AlN, GaN, GaP, AlAs, and AlSb, it may be possible to obtain a meta-optical device that may be used in the visible wavelength band ranging from about 400 nm to about 750 nm, the near-infrared wavelength band ranging from about 750 nm to about 1000 nm, and the ultraviolet wavelength band ranging from about 300 nm to about 400 nm. The meta-optical device may be used as, for example, the lens of a stepper for an I-line (365 nm), G-line (436 nm), or H-line (405 nm) in a semiconductor exposure process. Further, since desired optical modulation characteristics may be achieved by using a low aspect ratio, a critical dimension (CD) may be reduced to 20 nm in a process of forming the nano-structure NS. Accordingly, when an aspect ratio is 15:1, since the length 'D' and the thickness 't' of the nano-structure NS may range from about 20 nm to about 300 nm, a difficulty level of the process may be reduced and a degree of design freedom may be increased. The CD of $TiO_2$ as a comparative material is about 40 nm.

A method of manufacturing a meta-optical device will now be explained. FIGS. 8A through 8F are views illustrating a method of manufacturing a meta-optical device according to an exemplary embodiment.

Referring to FIGS. 8A through 8F, the method of manufacturing the meta-optical device includes preparing a substrate 300, forming a nano-material layer 310 on the substrate 300, and forming the nano-structures NS by patterning the nano-material layer 310.

The substrate 300 acts as the support layer SU, and is thus labeled "300(SU)" in FIGS. 8A through 8F. Accordingly, the substrate 300 may be a transparent substrate. The substrate 300 may be, for example, a glass substrate, a silicon dioxide ($SiO_2$) substrate, or a polymer substrate formed from PMMA or PDMS, or a silicon substrate.

Figure 8A:
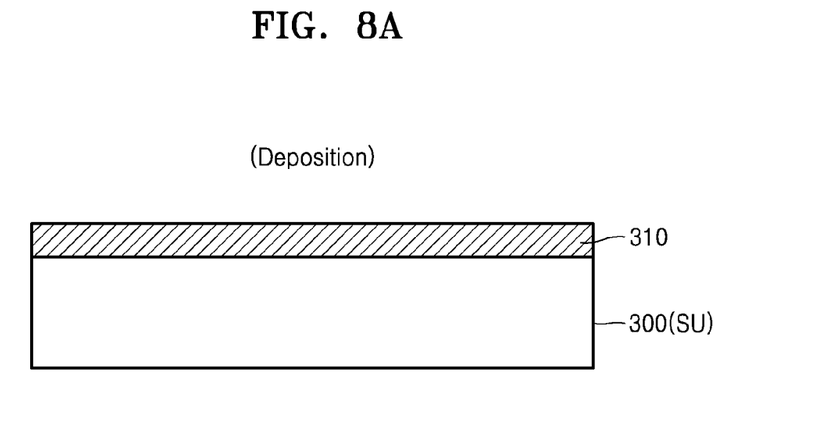
FIGS. 8A through 8F are views illustrating a method of manufacturing a meta-optical device according to an exemplary embodiment.

Once the substrate 300 is prepared, the nano-material layer 310 is formed on the substrate 300. The nano-material layer 310 may be formed by depositing a group III-V compound semiconductor such as AlN, GaN, GaP, AlAs, or AlSb on the substrate 300.

The deposition may be performed by epitaxially growing the group III-V compound semiconductor on the substrate 300 by using, for example, metal-organic chemical vapor deposition (MOCVD). In order to epitaxially grow the group III-V compound semiconductor, a buffer layer (not shown) has to be formed on the substrate 300. Accordingly, a substrate-buffer layer-nano-material layer structure is formed after the deposition. The buffer layer may affect optical modulation characteristics and a light transmittance. In addition, since MOCVD is a relatively high temperature process, a surface of the nano-material layer 310 may become rough, it may be difficult to achieve an RMS surface roughness (Rq) of 2.5 nm, and an oxide film may be formed on a surface of the nano-material layer 310. Accordingly, a process for achieving an RMS surface roughness (Rq) of 2.5 nm for a single-layer structure without a buffer layer and an oxide film is required. Also, since MOCVD is a relatively expensive process, a process of achieving a single-layer structure at low cost is required.

The present exemplary embodiment provides an inexpensive process of achieving an RMS surface roughness (Rq) of 2.5 nm for a single-layer structure without a buffer layer and an oxide film by using non-epitaxial deposition using a relatively inexpensive and low-temperature sputtering process and a crystallization process using post-annealing.

As shown in FIG. 8A, the nano-material layer 310 that is a group III-V compound semiconductor layer is formed on the substrate 300 by using a sputtering process. For example, the group III-V compound semiconductor may be a material selected from among AlN, GaN, GaP, AlAs, and AlSb. A thickness of the nano-material layer 310 may be appropriately determined in consideration of an optical function to be performed. A sputtering temperature is determined so as to obtain the nano-material layer 310 having a desired composition ratio. The sputtering temperature may also be determined such that that an oxide film is formed having a thickness of less than, for example, about 2 nm, or such that an oxide film is not formed on the nano-material layer 310 due to oxidation of the nano-material layer 310. If the sputtering temperature is too high, a desired an RMS surface roughness (Rq) of, for example, 2.5 nm, may not be achieved. Accordingly, the sputtering temperature is determined such that the sputtering temperature is not too high. For example, the sputtering temperature may range from about 150° C. to about 350° C.

Table 2 shows a compositional analysis result of the nano-material layer 310 at given sputtering temperatures. It was found that a constant ratio Ga:P≈1:1 was present when the sputtering temperature was equal to or higher than 150° C. In Table 2, the nano-material layer 310 is a GaP layer, a sputtering power is 150 W, a sputtering pressure is 2 mTorr, an argon (Ar) flow rate is 60 standard cubic centimeters per minute (sccm), an operation time is 470 seconds, a thickness is 195 nm, and a deposition rate is 2.49 nm/min.

TABLE 2

| | Sputtering temperature (° C.) | | | |
|---|---|---|---|---|
| | 25 | 200 | 300 | 400 |
| Ga (at %) | 50.3 | 49.6 | 49.6 | 49.6 |
| P (at %) | 48.7 | 49.4 | 49.4 | 49.5 |
| Ar (at %) | 1.0 | 1.0 | 1.0 | 1.0 |
| Density (g/cm$^3$) | 4.14 | 4.14 | 4.14 | 4.14 |

Upon examining the results of sputtering using GaP, it was found that when a GaP thin film with a thickness of 120 nm was formed at a sputtering temperature higher than 400° C., an oxide film was formed to a thickness of 10 nm to 15 nm (about 10%) on a surface of the GaP thin film.

The sputtering pressure may range from about 1 mTorr to about 4 mTorr. The sputtering power may range from about 100 W to about 250 W. The sputtering pressure and the sputtering power may be appropriately determined so as to obtain a desired material composition ratio for the nano-material layer 310.

Figure 8B:
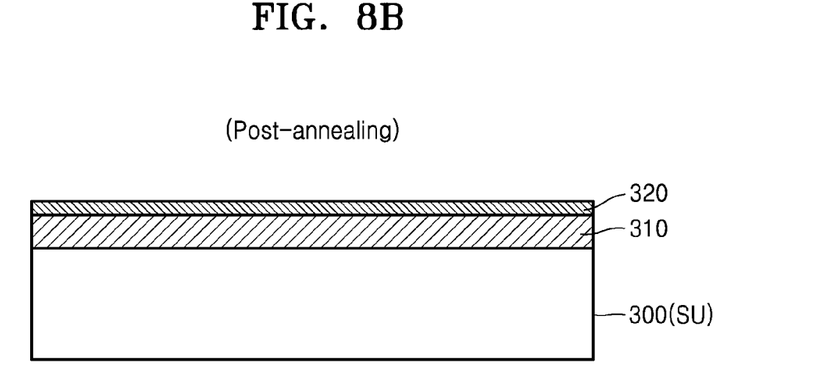

The nano-material layer 310 formed on the substrate 300 as a result of the sputtering process discussed above is not yet crystallized. In order to obtain a crystallized nano-material layer 310, a crystallization process using post-annealing is performed. In order to prevent oxidation of the nano-material layer 310 in the crystallization process, an anti-oxidation layer 320 may be formed on the nano-material layer 310 before the crystallization process is performed, as shown in FIG. 8B. For example, it was found that when the anti-oxidation layer 320 was not formed and post-annealing was performed on a GaP layer with a thickness of 120 nm at 550° C., an oxide film was formed over the entire GaP layer. The anti-oxidation layer 320 may be formed from, for example, $SiO_2$, $Si_3N_4$, $TiO_2$, or ITO. When the anti-oxidation layer 320 is too thin, its anti-oxidation function may not be performed efficiently. When the anti-oxidation layer 320 is too thick, the process wafer that includes the substrate 300, the nano-material layer 310, and the anti-oxidation layer 320 may be damaged as a result of stress accumulated on the anti-oxidation layer 320 during the process. Accordingly, a thickness of the anti-oxidation layer 320 may range from, for example, about 50 nm to about 1 μm. The process of forming the anti-oxidation layer 320 is not limited thereto, and for example, a $SiO_2$ layer may be formed via plasma-enhanced chemical vapor deposition (PECVD).

The crystallization process may be performed by post-annealing the nano-material layer 310 in an inert gas atmosphere, for example, an Ar atmosphere. The post-annealing temperature may be determined in consideration of the crystallization temperature of the group III-V compound semiconductor. Also, the extinction coefficient tends to decrease as the post-annealing temperature increases. The refractive index tends to slightly decrease as the post-annealing temperature increases. The lower limit of the post-annealing temperature is determined so as to obtain a desired extinction coefficient and a desired refractive index.

Table 3 shows the change of a refractive index at given post-annealing temperatures. The nano-material layer 310 was a GaP layer.

TABLE 3

| Wavelength | Post-annealing temperature (° C.) | | | |
|---|---|---|---|---|
| (nm) | 450 | 550 | 650 | 750 |
| B: 455 | 3.854 | 3.806 | 3.788 | 3.779 |
| G: 555 | 3.497 | 3.451 | 3.432 | 3.424 |
| R: 655 | 3.331 | 3.283 | 3.262 | 3.270 |

Table 4 shows refractive indices of polysilicon (p-Si) obtained by a green laser annealing (GLA) process, polysilicon (p-Si) obtained by a rapid thermal annealing (RTA) process, single-crystal silicon (c-Si), and GaP obtained by an MOCVD process.

TABLE 4

| Wavelength (nm) | p-Si (GLA) | p-Si (RTA) | c-Si | MOCVD GaP |
|---|---|---|---|---|
| B: 455 | 4.698 | 4.782 | 4.631 | 3.850 |
| G: 555 | 4.101 | 4.189 | 4.068 | 3.450 |
| R: 655 | 3.862 | 3.947 | 3.845 | 3.290 |

Referring to Tables 3 and 4, a refractive index of the nano-material layer 310 obtained by a sputtering process and a post-annealing process in a visible region is almost the same as a refractive index of the nano-material layer 310 obtained by an MOCVD process, which is relatively expensive.

Figure 10:
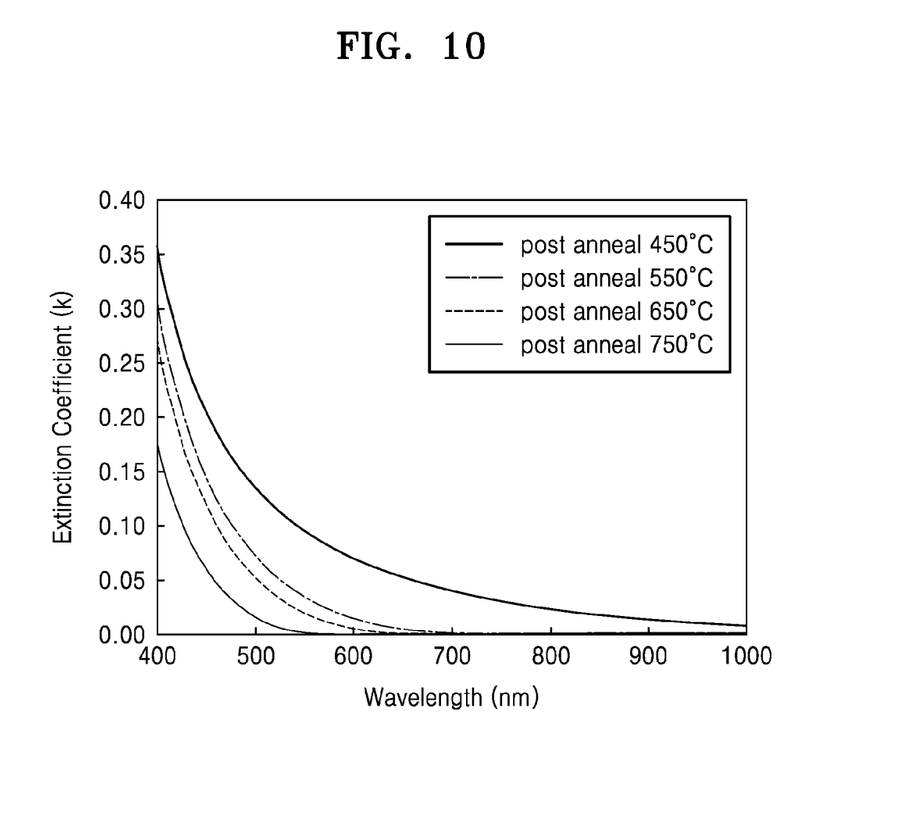
FIG. 10 is a graph showing an extinction coefficient according to different post-annealing temperatures.

FIG. 10 is a graph showing an extinction coefficient for different post-annealing temperatures. Table 5 shows the extinction coefficient according to the post-annealing temperature for FIG. 10. The nano-material layer 310 is a GaP layer.

TABLE 5

| Wavelength | Post annealing temperature (° C.) | | | |
|---|---|---|---|---|
| (nm) | 450 | 550 | 650 | 750 |
| B: 455 | 0.197 | 0.136 | 0.110 | 0.052 |
| G: 555 | 0.093 | 0.033 | 0.018 | $<1 \times 10^{-5}$ |
| R: 655 | 0.052 | 0.004 | $<1 \times 10^{-5}$ | $<1 \times 10^{-5}$ |

Table 6 shows the extinction coefficients of polysilicon (p-Si) obtained by a GLA process, polysilicon (p-Si) obtained by an RTA process, single-crystal silicon (c-Si), and GaP obtained by an MOCVD process.

TABLE 6

| Wavelength (nm) | p-Si (GLA) | p-Si (RTA) | c-Si | MOCVD GaP |
|---|---|---|---|---|
| B: 455 | 0.205 | 0.141 | 0.085 | 0.022 |
| G: 555 | 0.054 | 0.051 | 0.028 | $<1 \times 10^{-5}$ |
| R: 655 | 0.016 | 0.028 | 0.014 | $<1 \times 10^{-5}$ |

Referring to Tables 5 and 6, it was found that as the post-annealing temperature increased, the nano-material layer 310 formed from GaP has much better extinction coefficient characteristics than those of a nano-material layer formed of p-Si or c-Si in the visible region. That is, the nano-material layer 310 formed from GaP had extinction coefficient characteristics better than those of the nano-material layer formed from p-Si (GLA) at a post-annealing temperature of 450° C., had extinction coefficient characteristics better than those of the nano-material layer formed from p-Si (RTA) at a post-annealing temperature of 550° C., and had extinction coefficient characteristics similar to those of the nano-material layer formed from c-Si at a post-annealing temperature of 650° C. Further, the extinction coefficient of the nano-material layer 310 formed from GaP in the visible region is almost the same as that of a nano-material layer obtained by an MOCVD process, which is relatively expensive.

When the post-annealing temperature is too high, components of the group III-V compound semiconductor may become thermally dissociated. Accordingly, an upper limit of the post-annealing temperature is determined such that it does not to exceed a thermal dissociation temperature of the group III-V compound semiconductor. In this regard, the post-annealing temperature may range from, for example, about 400° C. to about 850° C.

Figure 8C:
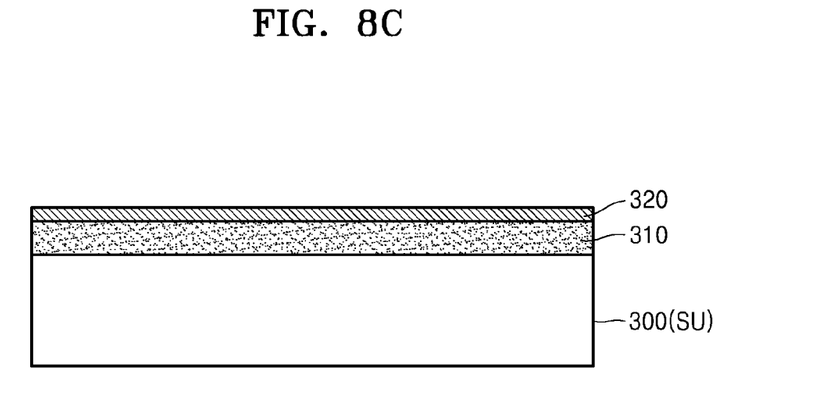

Due to the post-annealing process, a crystallized nano-material layer 310 may be obtained as shown in FIG. 8C. The term 'crystallization' does not mean complete crystallization, and includes a polycrystalline III-V compound semiconductor layer. Hereinafter, the crystallized nano-material layer 310 is illustrated via a dotted pattern.

Figure 8D:
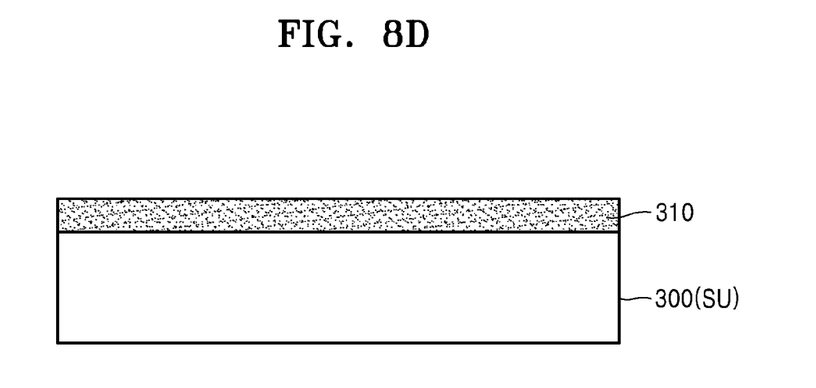

Next, the anti-oxidation layer 320 is removed. As an example, the removing of the anti-oxidation layer 320 may be performed by using a wet etching process. Accordingly, the crystallized nano-material layer 310 may be obtained on the substrate 300 as shown in FIG. 8D.

Figure 8E:
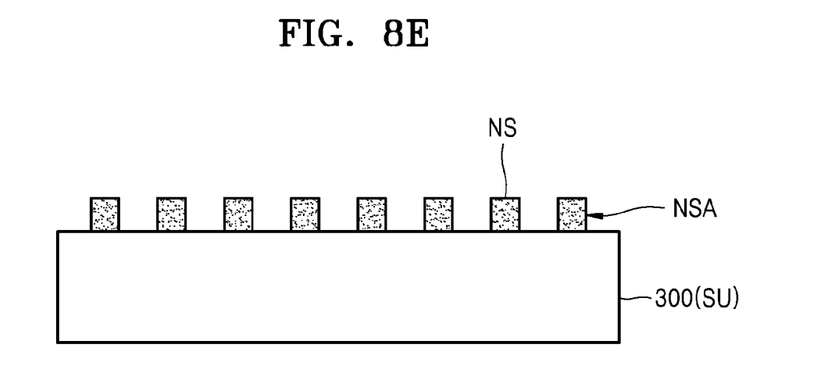

Next, a nano-structure array NSA in which a plurality of nano-structures NS are arranged is obtained as shown in FIG. 8E by patterning the crystallized nano-material layer 310. The method of patterning is not particularly limited, and may be performed by using, for example, an e-beam lithography process.

Figure 8F:
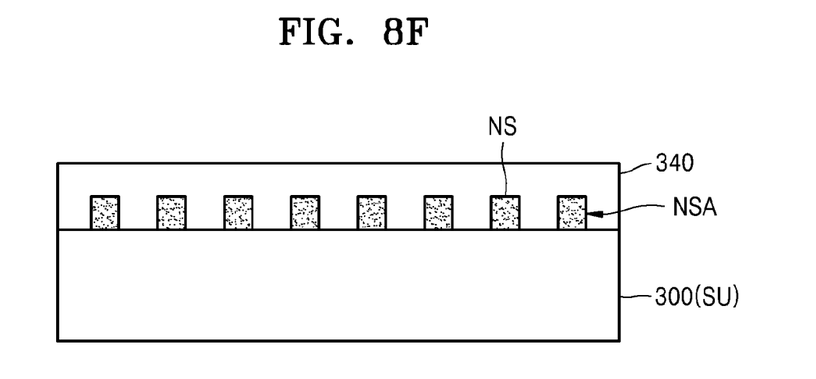

Next, if necessary, a cover layer 340 configured to cover the nano-structure array NSA is formed. The cover layer 340 may be formed from, for example, $SiO_2$, $Si_3N_4$, SOG, or glass. The process of forming the cover layer 340 is not particularly limited thereto.

Figure 9A:
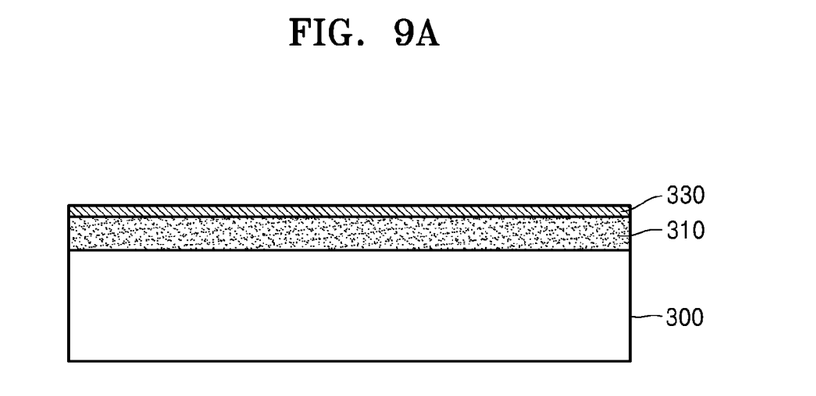
FIGS. 9A through 9C are views illustrating a method of manufacturing a meta-optical device according to an exemplary embodiment.
Figure 9B:
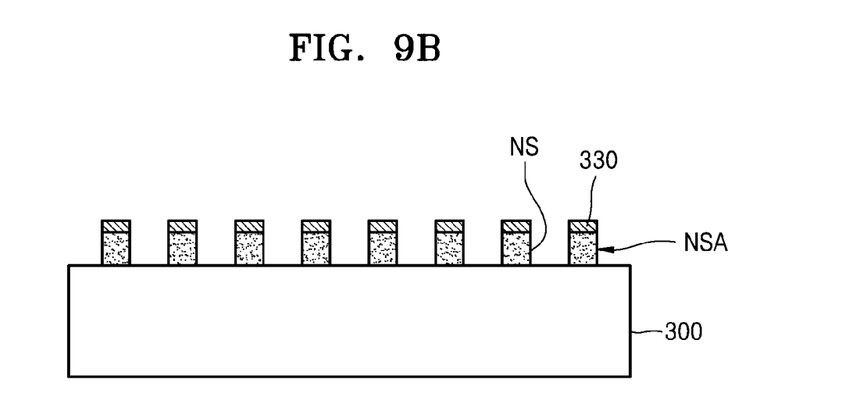
Figure 9C:
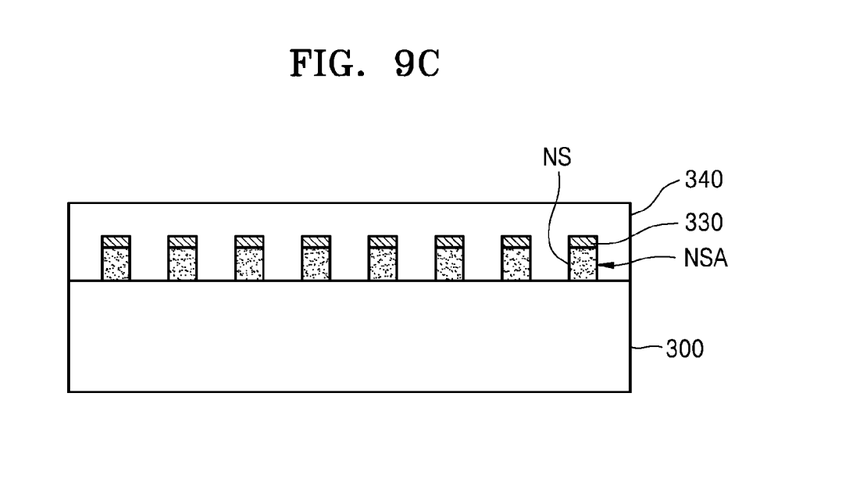

FIGS. 9A through 9C are views illustrating a method of manufacturing a meta-optical device according to an exemplary embodiment. Referring to FIG. 9A, after a crystallization process and a process of removing the anti-oxidation layer 320 are performed, and before a patterning process is performed, a process of forming a conductive layer 330 may be performed on the crystallized nano-material layer 310. The nano-material layer 310 formed from a non-conductive group III-V compound semiconductor may be charged during the patterning process. The conductive layer 330 is an anti-charging layer for preventing the nano-material layer 310 from being charged during the patterning process. The conductive layer 330 is a conductive thin film that allows exposure light used in the patterning process to be transmitted therethrough. The conductive layer 330 may be formed from, for example, ITO, IZO, or GIZO, which may transmit visible light therethrough. A thickness of the conductive layer 330 may range from, for example, about 1 nm to about 10 nm. The conductive layer 330 is patterned along with the nano-material layer 310 in the patterning process as shown in FIG. 9B. The conductive layer 330 may remain after the patterning process. In such a case, the meta-optical device of FIG. 9B or the meta-optical device of FIG. 9C with the cover layer 340 are obtained. The conductive layer 330 may also be removed after the patterning process. In such a case, the meta-optical device of FIG. 8E or 8F is obtained.

A nano-material layer 310 formed from GaP was formed on a substrate 300 via sputtering at 250° C. using a GaP target material having a ratio Ga:P=1:1. The sputtering pressure was about 2 mTorr and the power was about 150 W. An anti-oxidation layer 320 formed from $SiO_2$ and having a thickness of about 300 nm was formed on the nano-material layer 310. Next, a post-annealing process was performed at 750° C. in an Ar atmosphere with an oxygen concentration less than 50 ppm. The crystallized nano-material layer 310 was obtained by removing the anti-oxidation layer 320 via a wet etching process using hydrofluoric acid (HF).

As measured, the crystallized nano-material layer 310 had a refractive index n greater than 3.780 (n>3.780) and an extinction coefficient k less than 0.052 (k<0.052) at a wavelength of 455 nm. According to a transmission electron microscope (TEM) analysis result, the entire nano-material layer 310 was grown with crystallized GaP. A thickness of the surface oxide layer was less than 1 nm and the crystallized nano-material layer 310 with an oxide layer less than 2 nm was obtained. According to an atomic force microscope (AFM) and scanning electron microscope (SEM) analysis result, the RMS surface roughness (Rq) ranged from about 0.424 nm to about 0.669 nm. When annealing was performed at 450° C., the RMS surface roughness (Rq) was 0.223 nm.

Through the above processes, a nano-material layer 310 formed from a group III-V compound semiconductor, having a single-layer structure without a buffer layer may be formed. Also, since an inexpensive sputtering process instead of an expensive MOCVD process may be used, a meta-optical device that may be used for a semiconductor device may be realized. The meta-optical device may be formed on a semiconductor device without using an expensive laser annealing process. Accordingly, the low temperature polycrystalline silicon process may be replaced.

Table 7 shows process CDs for each of the listed wavelengths of Si, GaP, and $TiO_2$. Table 8 shows aspect ratios for each of the listed wavelengths of Si, GaP, and $TiO_2$.

TABLE 7

| Wavelength (nm) | Si | GaP | $TiO_2$ |
|---|---|---|---|
| 1550 | 300 nm | 400 nm | 500 nm |
| 860 | 100 nm | 130 nm | 170 nm |
| 455 | 30 nm | 40 nm | 50 nm |

TABLE 8

|  | Si | GaP | $TiO_2$ |
|---|---|---|---|
| Aspect ratio | 6:1 | 10:1 | 15:1 |

A nano-structure NS having an extinction coefficient that is less than that of Si and a refractive index that is greater than that of $TiO_2$ may be formed in the visible region by using a group III-V compound semiconductor. Accordingly, since a light absorbance is small in the visible wavelength band, a meta-surface structure having a high efficiency may be realized. And, since a high refractive index is achieved in the visible wavelength band, a meta-surface structure having a sufficient process margin may be realized. Referring to Tables 7 and 8, a pattern larger than that of p-Si or c-Si may be applied to the nano-structure NS formed from the group III-V compound semiconductor, and a pattern having an aspect ratio less than that of $TiO_2$ may be applied to the nano-structure NS formed from the group III-V compound semiconductor. Accordingly, the difficulty level of the patterning process may be reduced, and high yield may be ensured.

A meta-optical device including a group III-V compound semiconductor and having a single-layer structure with an RMS surface roughness (Rq) of 2.5 nm without a buffer layer and an oxide film may be manufactured at low cost as compared to a case where a MOCVD process is used.

While exemplary embodiments have been particularly shown and described, they are provided for the purposes of illustration only, and it will be understood by one of ordinary skill in the art that various modifications and equivalent other embodiments can be made from the present disclosure. Accordingly, the true technical scope of the present disclosure is defined by the technical spirit of the appended claims.

What is claimed is:

1. A meta-optical device comprising:
a support layer;
a plurality of nano-structures formed from a group III-V compound semiconductor provided on the support layer and arranged to form a shape-dimension distribution in which a phase of incident light varies based on a predetermined principle according to a position of a nano-structure from among the plurality of nano-structures upon which the incident light is incident; and
a plurality of conductive layers, each conductive layer from among the plurality of conductive layers being provided on a top surface of a respective nano-structure from among the plurality of nano-structures; and
a cover layer that covers top surfaces of the plurality of conductive layers,
wherein the plurality of nano-structures have shape dimensions of a sub-wavelength size and the shape dimensions are smaller than a wavelength of the incident light,
wherein the wavelength of the incident light ranges from 300 nm to 1000 nm,
wherein the plurality of nano-structures are formed from a material selected from the group consisting of AlN, GaN, and GaP,
wherein a respective dimension of each nano-structure from among the plurality of nano-structures varies according to a distance of the nano-structure from a center of the support layer,
wherein the cover layer fills a first region between adjacent conductive layers from among the plurality of conductive layers and a second region between adjacent nano-structures from among the plurality of nano-structures.

2. The meta-optical device of claim 1, wherein the wavelength of the incident light ranges from 400 nm to 750 nm.

3. The meta-optical device of claim 2, wherein each of the plurality of nano-structures has one of a cylindrical shape, a polyprism shape, and a stripe shape.

4. The meta-optical device of claim 2, wherein a refractive index of each of the plurality of nano-structures is greater than a refractive index of the support layer.

5. The meta-optical device of claim 2, wherein the cover layer has a refractive index that is different from a refractive index of each of the plurality of nano-structures.

6. The meta-optical device of claim 5, wherein the refractive index of the cover layer is the same as a refractive index of the support layer.

7. The meta-optical device of claim 1, wherein the respective dimension of each nano-structure from among the plurality of nano-structures decreases from the center of the support layer in a radial direction.

8. A meta-optical device comprising:
a support layer;
a plurality of nano-structures formed from a group III-V compound semiconductor provided on the support layer and arranged to form a shape-dimension distribution in which a phase of incident light varies based on a predetermined principle according to a position of a nano-structure from among the plurality of nano-structures upon which the incident light is incident;
a plurality of conductive layers, each conductive layer from among the plurality of conductive layers being provided on a top surface of a respective nano-structure from among the plurality of nano-structures; and
a cover layer that covers top surfaces of the plurality of conductive layers,
wherein the plurality of nano-structures have shape dimensions of a sub-wavelength size and the shape dimensions are smaller than a wavelength of the incident light,
wherein the wavelength of the incident light ranges from 300 nm to 1000 nm,
wherein the plurality of nano-structures are formed from a material selected from the group consisting of AlN, GaN, and GaP, wherein the support layer comprises at least one from among glass, silicon dioxide, polymethyl methacrylate, and polydimethylsiloxane,
wherein the plurality of nano-structures are provided directly on the support layer, and
wherein the cover layer fills a first region between adjacent conductive layers from among the plurality of conductive layers and a second region between adjacent nano-structures from among the plurality of nano-structures.

9. A method of manufacturing a meta-optical device, the method comprising:
preparing a substrate;
forming a nano-material layer by depositing a group III-V compound semiconductor on the substrate;
forming an anti-oxidation layer on the nano-material layer;
forming a crystallized nano-material layer by post-annealing the nano-material layer, thereby crystallizing the nano-material layer;
removing the anti-oxidation layer;
forming a conductive layer on a top surface of the crystallized nano-material layer;
forming a plurality of nano-structures and a plurality of conductive layers by patterning the crystallized nano-material layer and the conductive layer, the plurality of nano-structures have shape dimensions of a sub-wavelength size and the shape dimensions are smaller than a wavelength of incident light; and
forming a cover layer that covers top surfaces of the plurality of conductive layers and fills a first region between adjacent conductive layers from among the plurality of conductive layers and a second region between adjacent nano-structures from among the plurality of nanostructures,
wherein the nano-material layer is formed from a material selected from the group consisting of AlN, GaN, and GaP,
wherein a respective dimension of each nano-structure from among the plurality of nano-structures varies according to a distance of the nano-structure from a center of the substrate, and
wherein each conductive layer from among the plurality of conductive layers is provided on a top surface of a respective nano-structure from among the plurality of nano-structures.

10. The method of claim 9, wherein the forming the nano-material layer is performed by using a sputtering process.

11. The method of claim 10, wherein an upper limit of a sputtering temperature is determined so that a thickness of an oxide film formed on a surface of the nano-material layer during the sputtering process is less than 2 nm.

12. The method of claim 11, wherein the sputtering temperature ranges from about 150° C. to about 350° C.

13. The method of claim 9, wherein a thickness of the anti-oxidation layer ranges from about 50 nm to about 1 μm.

14. The method of claim 9, wherein the anti-oxidation layer is formed from a material selected from the group consisting of $SiO_2$, $Si3N_4$, $TiO_2$, and ITO.

15. The method of claim 9, wherein a temperature of the post-annealing is equal to or lower than a thermal dissociation temperature of the nano-material layer.

16. The method of claim 15, wherein the temperature of the post-annealing ranges from 400° C. to 850° C.

17. A meta-optical device manufactured by using the method of claim 9.

* * * * *